(12) United States Patent
Tsujimoto (10) Patent No.: US 8,070,972 B2
(45) Date of Patent: Dec. 6, 2011

(54) ETCHING METHOD AND ETCHING APPARATUS

(75) Inventor: Hiroshi Tsujimoto, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 1255 days.

(21) Appl. No.: 11/730,196

(22) Filed: Mar. 29, 2007

(65) Prior Publication Data
US 2007/0284335 A1 Dec. 13, 2007

Related U.S. Application Data

(60) Provisional application No. 60/794,841, filed on Apr. 26, 2006.

(30) Foreign Application Priority Data

Mar. 30, 2006 (JP) ................................. 2006-095438

(51) Int. Cl.
*B44C 1/22* (2006.01)
*C23F 1/00* (2006.01)

(52) U.S. Cl. ........... 216/41; 257/E21.252; 257/E21.257; 156/345.15

(58) Field of Classification Search ........................ None
See application file for complete search history.

(56) References Cited

U.S. PATENT DOCUMENTS

| | | | | |
|---|---|---|---|---|
| 5,883,006 A * | 3/1999 | Iba | | 438/712 |
| 6,004,706 A * | 12/1999 | Ausschnitt et al. | | 430/30 |
| 6,027,842 A * | 2/2000 | Ausschnitt et al. | | 430/30 |
| 6,121,098 A * | 9/2000 | Strobl | | 438/301 |
| 6,703,250 B2 * | 3/2004 | Chiu | | 438/9 |
| 6,808,946 B1 * | 10/2004 | Stirton et al. | | 438/16 |
| 6,867,084 B1 * | 3/2005 | Chiu et al. | | 438/216 |
| 6,869,542 B2 * | 3/2005 | Desphande et al. | | 216/51 |
| 6,895,295 B1 * | 5/2005 | Grover et al. | | 700/121 |
| 7,580,134 B2 * | 8/2009 | Muroya | | 356/511 |
| 7,751,046 B2 * | 7/2010 | Levy et al. | | 356/401 |
| 2002/0056700 A1 * | 5/2002 | Ohmori | | 216/84 |
| 2003/0033120 A1 * | 2/2003 | Chiou | | 702/188 |
| 2004/0167640 A1 * | 8/2004 | Knappe et al. | | 700/57 |

(Continued)

FOREIGN PATENT DOCUMENTS

JP 2003-282536 10/2003

*Primary Examiner* — Allan Olsen
(74) *Attorney, Agent, or Firm* — Smith, Gambrell & Russell, LLP (57) ABSTRACT

The present invention relates to an etching method for etching a film to form a concave portion therein with the use of a photoresist mask provided with an opening. In this method, there is determined, in advance, a first correlation between a parameter value and an opening dimension of the concave portion, as a process parameter for the etching process, when the etching process is conducted with the use of the mask provided with the opening of a reference opening dimension. In addition, there is determined, in advance, a second correlation between a variation in opening dimension of the mask and a variation in opening dimension of the concave portion. When conducting the etching process, an actual opening dimension of the mask is measured. A target parameter value of the process parameter for achieving a target opening dimension of the concave portion is determined, based on a difference between the actual opening dimension of the mask and the reference opening dimension thereof, the target opening dimension of the concave portion to be formed, and the first and second correlations.

3 Claims, 7 Drawing Sheets

U.S. PATENT DOCUMENTS

| | | |
|---|---|---|
| 2004/0225401 A1* | 11/2004 | Mack et al. .................... 700/121 |
| 2005/0022932 A1* | 2/2005 | Kagoshima et al. ...... 156/345.24 |
| 2005/0154482 A1* | 7/2005 | Tomoyasu .................... 700/108 |
| 2005/0168716 A1* | 8/2005 | Ausschnitt ....................... 355/55 |
| 2005/0192700 A1* | 9/2005 | Holfeld et al. ................. 700/121 |
| 2005/0219548 A1* | 10/2005 | Muroya ......................... 356/504 |
| 2006/0089741 A1* | 4/2006 | Mack et al. .................... 700/121 |
| 2006/0184264 A1* | 8/2006 | Willis et al. ................... 700/108 |
| 2009/0066967 A1* | 3/2009 | Muroya ......................... 356/504 |
| 2009/0276078 A1* | 11/2009 | Sugamoto et al. ............ 700/121 |

* cited by examiner

| | MASK PATTERN | FILM HOLE | | | |
|---|---|---|---|---|---|
| $CF_4$ (sccm) | — | 200 | 190 | 180 | 170 |
| A1, A2 | 140nm | 160nm | 148nm | 134nm | 118nm |
| B1, B2 | 220nm | 240nm | 218nm | 200nm | 172nm |

| MASK PATTERN | | FILM HOLE | | | |
|---|---|---|---|---|---|
| CF$_4$ (sccm) | — | 170 | 180 | 190 | 200 |
| A1, A2 | 140nm | 118nm | 134nm | 148nm | 160nm |
| | 120nm | 98nm | 114nm | 126nm | 142nm |
| ΔA1, ΔA2 | 20nm | 20nm | 20nm | 22nm | 18nm |

ETCHING METHOD AND ETCHING APPARATUS

CROSS REFERENCE TO RELATED APPLICATIONS

This application claims a priority of U.S. provisional application No. 60/794,841 filed on Apr. 26, 2006, and the entire contents of which are incorporated herein by reference.

BACKGROUND OF THE INVENTION

1. Technical Field

The present invention relates to an etching method and etching apparatus for etching a film to form a concave portion therein with the use of a photoresist mask.

2. Description of the Related Art

Recently a degree of integration in a semiconductor has been becoming increasingly higher. In association with technical improvements in resist materials and exposure technique to satisfy the need for more minute patterns formed on a wafer, an opening dimension has become substantially smaller. On the other hand, as the patterns formed on a wafer become smaller, requirements for precision in finished dimension of an opening of a hole (a contact hole or a via hole) or a width of a trench (a wiring groove) have become more and more strict.

To satisfy the needs, as described, for instance, JP 2003-282536A, proposes an idea in which a relation between the type or the feed rate of a reaction gas and an etching speed are determined in advance and the feed rate is controlled based on, for example, an etching depth.

In the photolithography, a finished state of a developed pattern is determined based on a lot of conditions including conditions for applying a resist, conditions for heating the applied resist, conditions for exposure, conditions for heating the exposed resist, and conditions for development treatment. Thus, it is practically impossible to obtain a uniform opening dimension of a photoresist mask, and the dispersion in opening dimension is unavoidable. Therefore, the finished dimension of the pattern after a film is etched may vary caused by the variation of the opening dimension.

If the finished dimension of a concave portion of a film that has been etched is deviated from the design value, a designed device performance cannot be obtained. Also, if the finished dimension is larger than the design value, adjacent via holes or adjacent contact holes are closer to each other, which may cause a short circuit between the holes. In addition, recently, a multilayered resist structure has been developed. However, when holes in an organic film in the bottom layer of the multilayered photoresist are close to each other, the photoresist may fall.

For the reasons as described above, even if process conditions for etching are determined based on a desired finished state after etching, the desired finished state may be influenced by the dispersion in the mask pattern formed in the previous process of the etching process, which is another reason for difficulty in miniaturization of patterns.

SUMMARY OF THE INVENTION

The present invention was made to solve the problems as described above, and an object of the present invention is to provide a technique for suppressing the dispersion in opening dimensions of concave portions, when an etching process is conducted to form a concave portion in a film with the use of a photoresist mask.

In order to achieve this object, the present invention provides an etching method for subjecting an object to be processed to an etching process, the object including: a substrate; a film to be etched that is formed on the substrate; and a photoresist mask provided with an opening, the photoresist mask being formed on the film; to form a concave portion in the film; the etching method comprising the steps of: determining, in advance, a first correlation between a parameter value and an opening dimension of the concave portion, as a process parameter for the etching process, when the etching process is conducted with the use of the mask provided with the opening of a reference opening dimension; determining, in advance, a second correlation between a variation in opening dimension of the mask and a variation in opening dimension of the concave portion; measuring an actual opening dimension of the mask in the object that is to be subjected to the etching process; determining a target parameter value of the process parameter for achieving a target opening dimension of the concave portion, based on a difference between the actual opening dimension of the mask and the reference opening dimension of the mask, the target opening dimension of the concave portion to be formed, and the first and second correlations; and conducting an etching process to the object to be processed, so as to make the process parameter correspond to the target parameter value.

The opening dimension of the concave portion as used herein means an opening of a hole such as a contact hole or a via hole or a width of a trench.

In addition, the present invention provides an etching apparatus for subjecting an object to be processed to an etching process, the object including: a substrate; a film to be etched that is formed on the substrate; and a photoresist mask provided with an opening, the photoresist mask being formed on the film; to form a concave portion in the film; the etching apparatus comprising: (i) a storage section that stores: a first correlation between a parameter value and an opening dimension of the concave portion, as a process parameter for the etching process, when the etching process is conducted with the use of the mask provided with the opening of a reference opening dimension; and a second correlation between a variation in opening dimension of the mask and a variation in opening dimension of the concave portion; (ii) means for determining a target parameter value of the process parameter for achieving a target opening dimension of the concave portion, based on: a difference between an actual opening dimension of the mask measured in the object that is to be subjected to the etching process, and the reference opening dimension of the mask; the target opening dimension of the concave portion to be formed; and the first and second correlations stored in the storage section; and (iii) means for conducting an etching process to the object to be processed, so as to make the process parameter correspond to the target parameter value.

When the etching process is conducted by using at least two types of etching gases, the process parameter may be a ratio of flow rates of the etching gases. In this case, the film to be etched is a reflection preventing film containing silicon, oxygen, and nitrogen, and the etching gases may be a $CF_4$ gas and a $C_4F_8$ gas.

The present invention also relates to a computer-readable storage medium storing a control program for performing the etching method by the etching apparatus.

With the present invention, even when there is dispersion in actual opening dimensions of concave portions in a photoresist mask for use in the etching process, dispersion in opening dimensions of concave portions which are formed in a film to be etched can be suppressed. As a result, reduction in the yield in the etching process can be prevented.

DETAILED DESCRIPTION OF THE PREFERRED EMBODIMENTS

An object to be processed which is used in an embodiment of the present invention includes: a semiconductor wafer as a substrate; a film to be etched as an interlayer insulation film formed on the wafer; and a photoresist film (hereinafter referred to as "resist film") as a photoresist mask formed on the film to be etched, the resist film having an elliptical opening (resist pattern). The whole object to be processed is also referred to as "wafer" as the matter of convenience.

Next, a surface structure of the wafer and an etching process performed to the wafer are briefly described with reference to FIG. 1.

Figure 1:
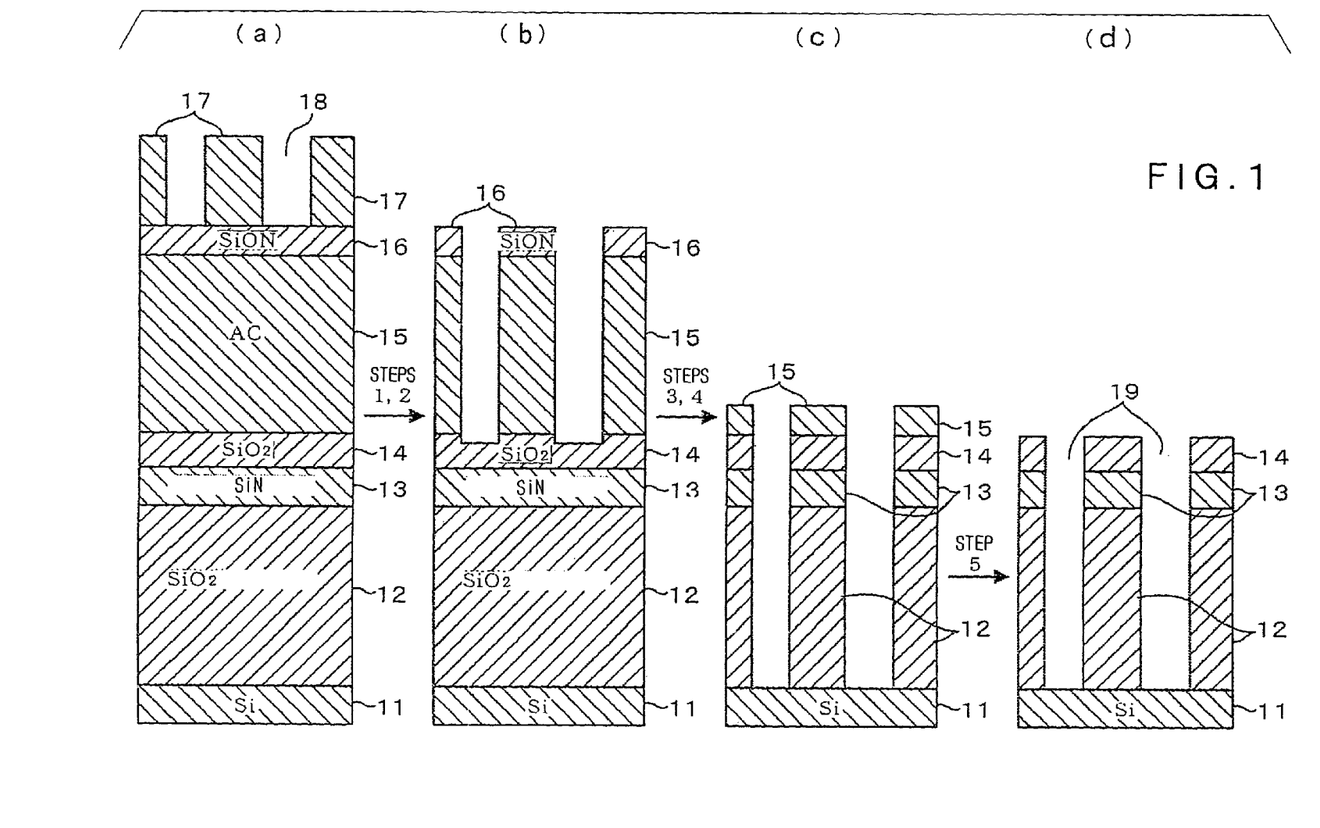
FIG. 1 is a view illustrating an etching process according to the present invention.

As shown in FIG. 1(a), a silicon film 11, an $SiO_2$ (silicon oxide) film 12, an inorganic film 13, an $SiO_2$ film 14, an amorphous carbon (AC) film 15, an SiON (nitride-oxide silicon) film 16 which is a reflection preventing film, and a resist film 17 are laminated on the surface of the wafer W in this order. The thicknesses of the $SiO_2$ film 12, the inorganic film 13, the $SiO_2$ film 14, the amorphous carbon (AC) film 15, the SiON film 16, and the resist film 17 are 500 nm, 90 nm, 100 nm, 500 nm, 65 nm, and 250 nm respectively. In the figure, reference numeral 18 denotes a resist pattern which is an opening formed on the resist film 17, and the opening has an elliptical form when viewed from the top. The $SiO_2$ film 12 is grown by using TEOS (tetraethoxysilane) as a film growth material in this example, and contains boron (B) and phosphor (P). The inorganic film 13 is a silicon nitride (SiN) film, and in this embodiment, the inorganic film 13 is a silicon-rich film containing Si more than a content determined stoichiometrically.

In the etching process according to this embodiment, a hole is formed by etching the SiON film 16 along the resist pattern 18 in step 1, and then the AC film 15 is etched along a form of the hole using the SiON film 16 as a mask in step 2 (Refer to FIG. 1(b)). In this step, also the resist film 17 is removed. Then the $SiO_2$ film 14 and the SiN film 13 are etched along a form of the hole in step 3, and then the $SiO_2$ film 12 is formed along a form of the hole in step 4 (Refer to FIG. 1(c)).

When the etching in step 3 and step 4 is completed, the SiON film 16 is removed. Then, the remaining AC film 15 is ashed to be removed in step 5 (Refer to FIG. 1(d)). By carrying out the steps as described above, a hole 19 is formed, and the hole 19 is a concave portion extending through the $SiO_2$ film 14 (which is the film to be subjected to etching), the SiN film 13, and the $SiO_2$ film 12.

Figure 2:
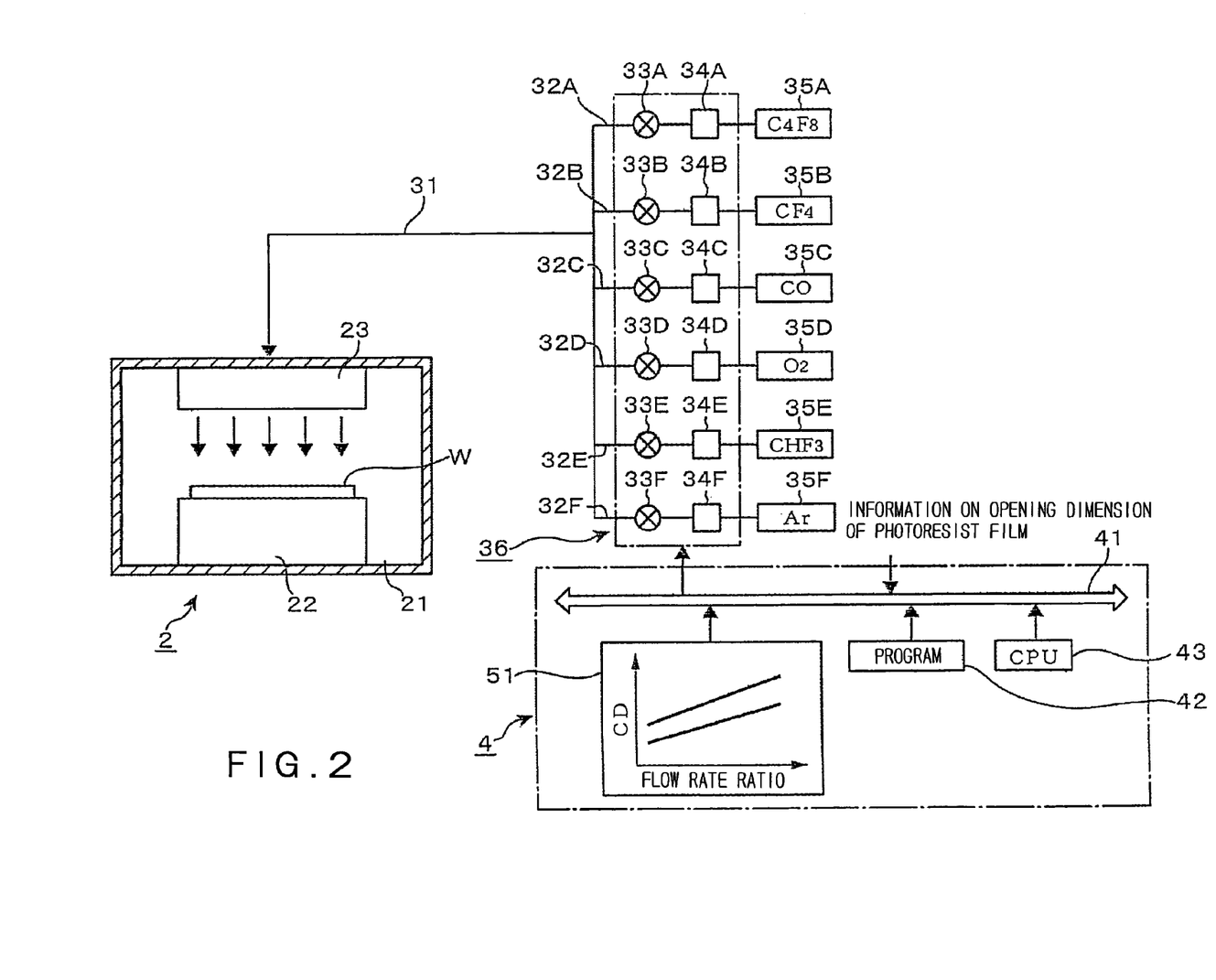
FIG. 2 is a diagram illustrating the entire configuration of an etching apparatus for carrying out the present invention.

An example of the entire configuration of an etching apparatus for carrying out the etching process by controlling an opening dimension (CD) of the hole 19 is described with reference to FIG. 2 below.

This etching apparatus 2 has a processing chamber 21, and a mounting stage 22 for mounting a wafer W is provided in the processing chamber 21. In the figure, reference numeral 23 denotes a gas shower head, which supplies various types of gasses fed from gas sources to the wafer W placed on the mounting stage 22. This gas shower head 23 also functions as an upper electrode to which a high frequency power is applied to convert a process gas into plasma. The mounting stage 22 includes a lower electrode to which a high frequency power is applied. The lower electrode causes the wafer W to generate a bias voltage. Also, the lower electrode draws ions to improve verticality of the etched portions.

In the figure, reference numeral 31 denotes a gas inlet pipe, and an end portion of the gas inlet pipe 31 is connected to the gas showerhead 23. The other end portion of the gas inlet pipe 31 is divided to a plurality of branch pipes 32A to 32F on the upstream side, and end portions of the branch pipes 32A to 32F are connected to a $C_4F_8$ gas source 35A, a $CF_4$ gas source 35B, a CO gas source 35C, an $O_2$ (oxygen) gas source 35D, a $CHF_3$ gas source 35E, and an Ar gas source 35F, respectively.

Valves 33A to 33F and flow rate control sections 34A to 34F are sequentially provided toward the upstream side in the branch pipes 32A to 32F respectively. The valves and the flow rate control sections constitute a gas supply system 36. The gas supply system 36 is connected to the control section 4, and controls feed ON/OFF of the process gases to the gas sources 35A to 35F, and flow rates of the process gases, based on a control signal from the control section 4.

A configuration of the control section 4 is described below. The control section 4 comprises, for instance, a computer and an input screen used for setting, for instance, a target opening dimension of the hole 19 to be formed and other process parameters for etching. Reference numeral 41 in the figure is a bus. Connected to this bus 41 are a program storage section 42 (reference numeral 42 is assigned to the program stored in the program storage section 42 for convenience in the following description), a CPU 43 for executing various types of processing, and a storage section 51, and information for an actual opening dimension of a bottom section of the resist pattern 18 on the resist film 17 measured in the previous step of the etching process is input in the bus 41.

The program 42 includes a group of steps for carrying out the etching process, and control signals are sent to various sections of the etching apparatus 2 based on the steps. In the etching process, based on the actual opening dimension of the resist pattern 18 and the target opening dimension of the hole 19, which have been input, and information in the below-described storage section 51, the program 42 computes a target parameter value of a process parameter (a rate of flow rates of the etching gases used in the step 1) for achieving the target opening dimension of the hole 19 after completion of the etching process.

The program 42 is stored in a storage medium including, for instance, a flexible disk, a compact disk, an MO (magnetic optical) disk and is installed in the control section 4.

Figure 3A:
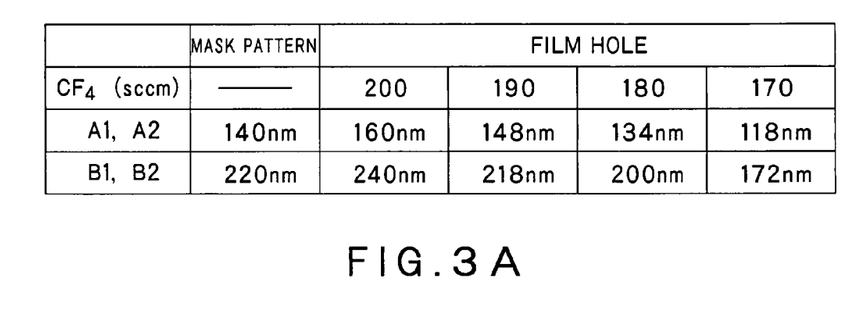
FIG. 3A is a table illustrating data on actual opening dimensions of holes and a gas flow rate.
Figure 3B:
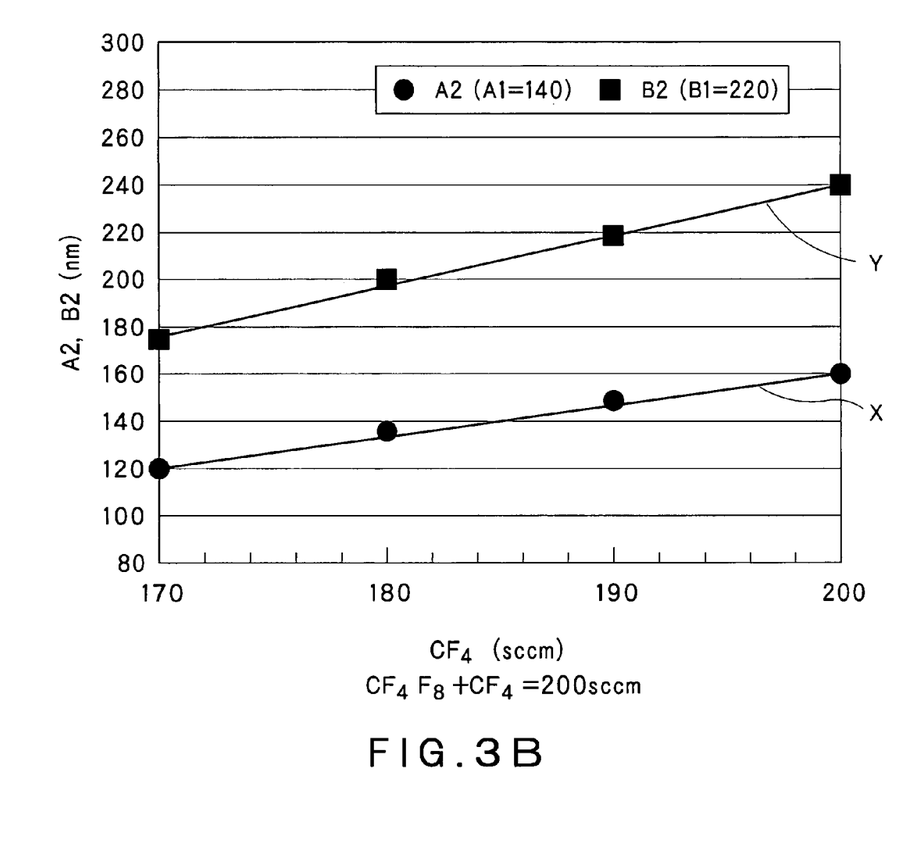
FIG. 3B is a graph illustrating a relation between actual opening dimension of holes and a gas flow rate in a control section based on the data of FIG. 3A.

A graph is stored in the storage section 51. As shown in FIG. 3B, the graph shows a relation between flow rates of the $CF_4$ gas and the $C_4F_8$ gas and an actual opening dimension (CD) of the hole 19 formed by carrying out the step 1 of the etching process to the wafer W using the $CF_4$ gas and the $C_4F_8$ gas. FIG. 3A shows specific numerical values for each plot used as base data for preparation of the graph.

Figure 4:
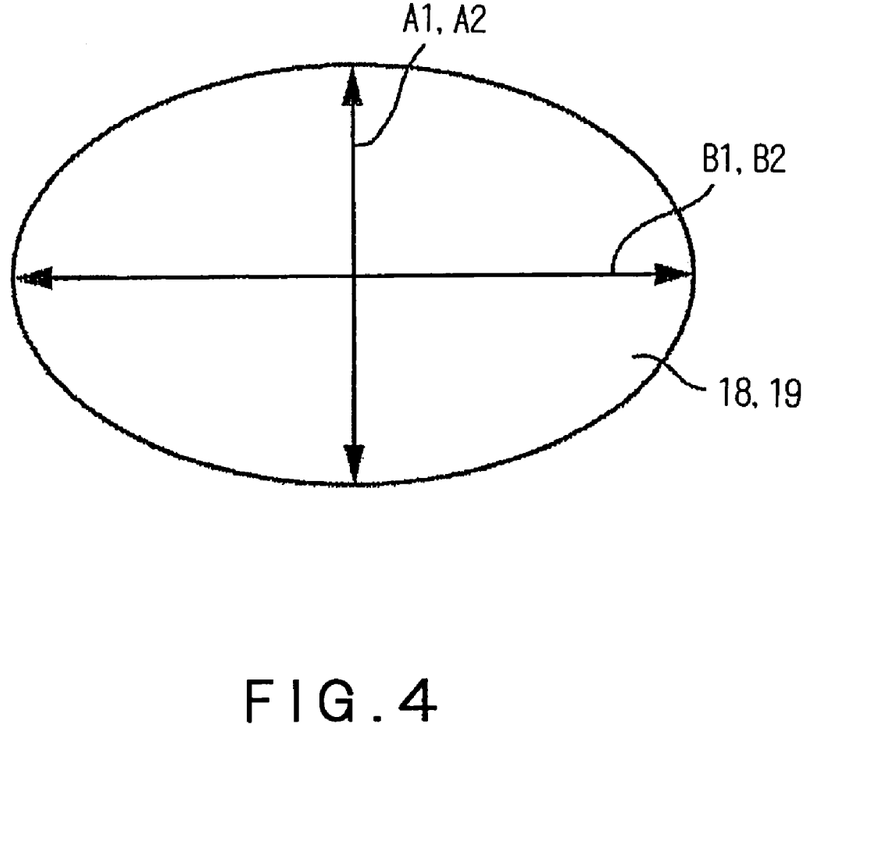
FIG. 4 is a view illustrating an upper surface of the hole.

As shown in FIG. 4, the resist pattern 18 of the resist film 17 before being subjected to etching has an elliptical form, and a short diameter and a long diameter (reference opening dimensions A1 and B1) at a bottom portion of the pattern is 140 nm and 220 nm respectively. On the other hand, also the hole 19 formed in the $SiO_2$ film has an elliptical form. A short diameter and a long diameter (actual opening dimensions A2 and B2) of the upper portion are corresponding to each flow rate of the $CF_4$ gas are described in FIGS. 3A and 3B.

The horizontal axis of the graph in FIG. 3B shows a flow rate of the $CF_4$ gas when a total flow rate of the $CF_4$ gas and the $C_4F_8$ gas is set to 200 sccm. However, a finished state of etching is influenced not by a value for the total flow rate, but by a ratio of flow rates of the two types of gases. Therefore, it may be said that the horizontal axis shows a ratio of a flow rate of the $CF_4$ gas to the total flow rate. Thus, as a process parameter P for determining a target parameter value, this flow rate ratio is used herein. However, when referring to the graph, the flow rate ratio is also simply referred to as "flow rate of the $CF_4$ gas" as the matter of convenience.

Approximate straight lines X and Y are prepared by connecting plots in the actual opening dimensions A2 and B2. In the case where the short diameter A1 (long diameter B1) as a reference opening dimension of the resist pattern 18 is 140 nm (220 nm), when a flow rate of the $CF_4$ gas and that of the $C_4F_8$ gas (a ratio of the flow rates of the two types of gases) are changed along the horizontal axis of the graph, the short diameter A2 (long diameter B2) as an actual opening dimension of the hole 19 is changed (first correlation) along the approximate straight line X (approximate straight line Y). Correlation coefficients of the approximate straight lines X and Y are 0.99 or more, respectively.

Figure 7A:
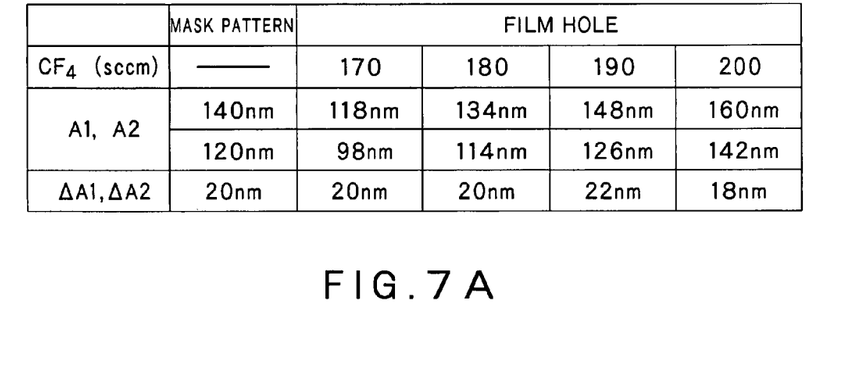
FIG. 7A is a table illustrating a variation in a reference opening dimension (short diameter) of the mask and a variation in an actual opening dimension of the hole.
Figure 7B:
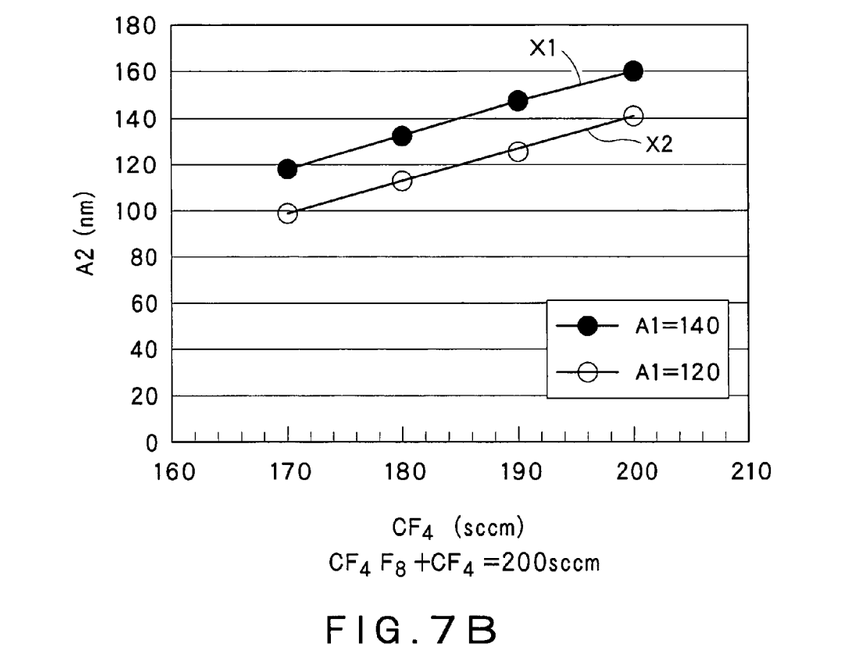
FIG. 7B is a graph similar to FIG. 3B based on the data of FIG. 7A.

Similar to FIGS. 3A and 3B showing measurement results of the reference opening dimensions of the pattern 18 and the actual opening dimensions of the hole 19, FIGS. 7A and 7B respectively show measurement results of the opening dimensions, in which only the short diameters A1 and A2 are shown. Herein, there are shown data on the actual dimension A2 of the hole in the case where the reference opening dimension A1 of the pattern is 120 nm. FIG. 7A shows a variation ΔA2 of the actual opening dimension A2 of the hole, when the reference opening dimension A1 of the pattern is changed from 120 nm to 140 nm (when a variation ΔA1 of the reference opening dimension A1 is 20 nm). In the graph of FIG. 7B, a line corresponding to the approximate straight line X in FIG. 3B (when A1=140 nm) is indicated by the reference character X1, and an approximate straight line when A1=120 nm is indicated by the reference character X2. Based on the results shown in FIGS. 7A and 7B, a relationship between the variations ΔA1 and ΔA2 of the respective opening dimensions is considered to be a linear relationship ΔA2=ΔA1 (second correlation) with its proportionality constant being substantially 1, when the reference opening dimension A1 is at least within a range between about 120 nm and 140 nm and the actual opening dimension A2 is at least within a range between about 100 nm to 135 nm. This second correlation is stored in the storage section 51 in advance.

In order to form the hole 19 having a target opening dimension (short diameter) a2 with the use of the resist pattern 18 having the actual opening dimension (short diameter) a1, a flow rate of the $CF_4$ gas which is a target parameter value required therefore is determined in the following manner.

At first, a difference between the actual opening dimension a1 and the reference opening dimension A1 of the pattern 18, i.e., ΔA1=A1−a1 is calculated. Application of the second correlation ΔA2=ΔA1 to the difference leads to ΔA2=A1−a1. Then, the value of ΔA2 is applied to the graph (line X) of FIG. 3B showing the first correlation. Firstly, a conversion opening dimension A2' is obtained by adding ΔA2 to the target opening dimension a2, i.e., A2'=a2+ΔA2=a2+(A1−a1)=a2+(140−a1) (nm). Then, a flow rate of the $CF_4$ gas (flow rate ratio) indicated by a point on the line X corresponding to the conversion opening dimension A2' is determined as a target parameter value.

Figure 6:
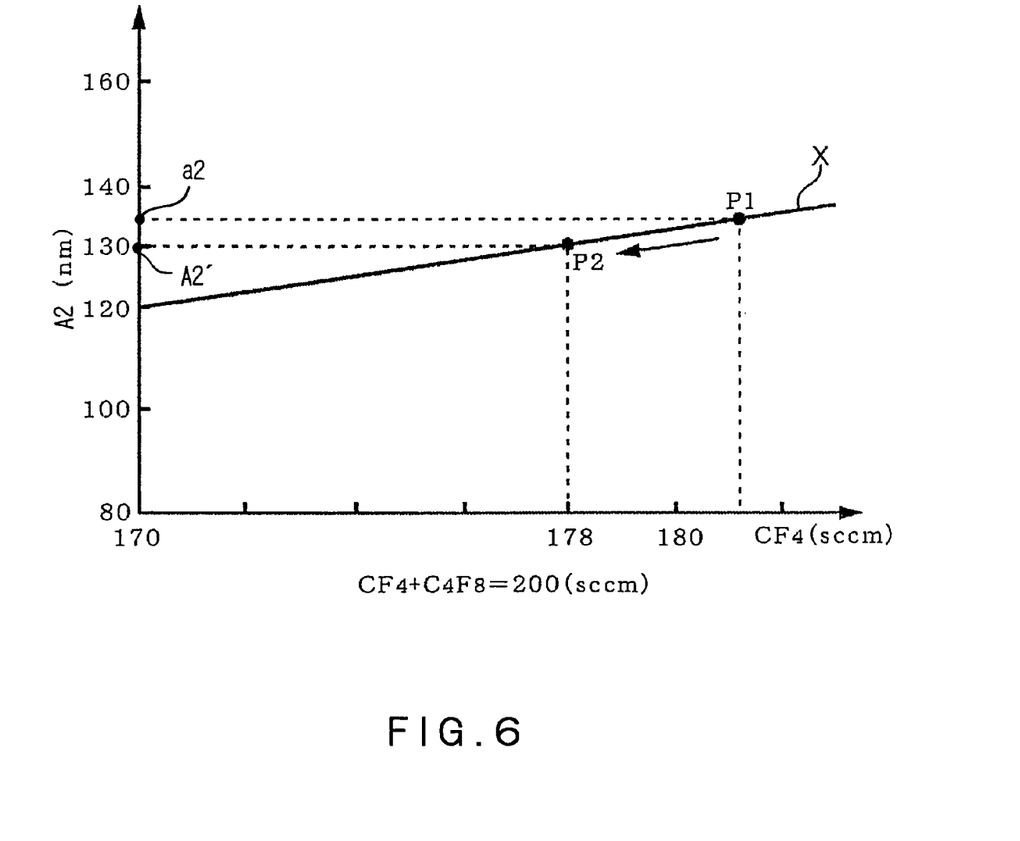
FIG. 6 is a view illustrating a sequence of operations for determining a flow rate ratio for achieving a target opening dimension of the hole based on a reference opening dimension of the mask based on the graph shown in FIG. 3.

A concrete example of the determination operation of a target parameter value is described with reference to FIG. 6. The numerical values of the respective opening dimensions (short diameters) are as follows.

Reference opening dimension A1 of pattern: 140 nm
Actual opening dimension a1 of pattern: 145 nm
Target opening dimension a2 of hole: 135 nm In this case, the conversion opening dimension A2' is: A2'=a2+(A1−a1)=135+(140−145)=130 nm. Thus, a target parameter value is determined as 178 sccm of the flow rate of the $CF_4$ gas (flow rate ratio), which is indicated by a point P2 on the line X corresponding to the conversion opening dimension A2'.

On the other hand, when the actual opening dimension a1 of the pattern is identical to the reference opening dimension A1 thereof, the conversion opening dimension A2' is equal to the target opening dimension a2. Thus, the target opening dimension a2 can be directly applied to the line X. Namely, a target parameter value is determined as about 181 sccm of the flow rate of the $CF_4$ gas (flow rate ratio), which is indicated by a point 1 on the line X corresponding to the target opening dimension a2=135 nm. From another point of view, the point P1 on the line X indicating the parameter value moves to the point. P2 according to the second correlation in response to the difference between the actual opening dimension a1 and the reference opening dimension A1 of the pattern.

Figure 5:
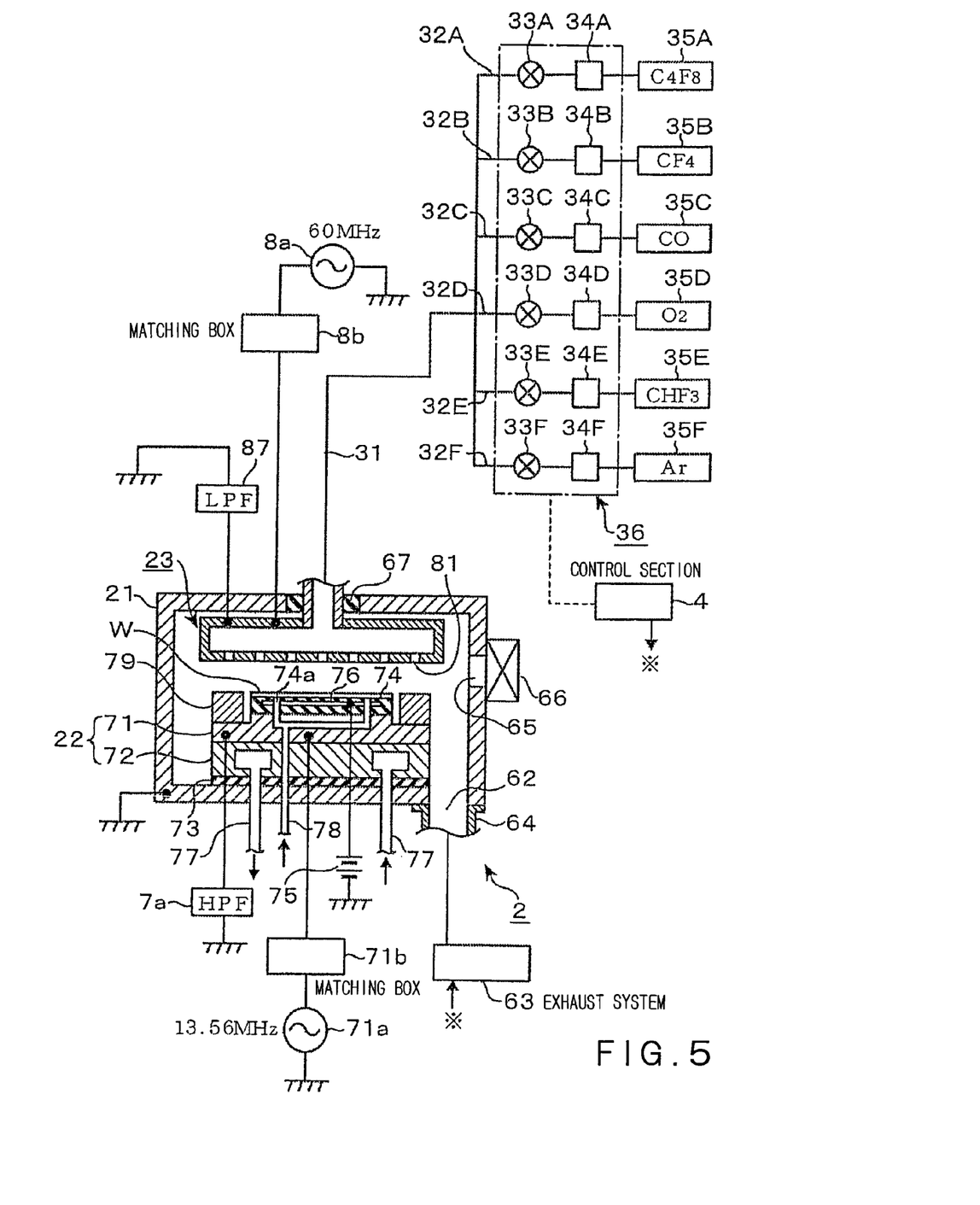
FIG. 5 is a longitudinal cross-sectional view illustrating an example of the etching apparatus.

Next, a configuration of the etching apparatus 2 described above is described in detail below with reference to FIG. 5.

The surface of the processing chamber 21 is coated with anodized aluminum, and inside of the processing chamber 21 is, for instance, a sealed space. The mounting stage 22 is provided at a center of a bottom surface of the processing chamber 21, and the upper electrode 23 (gas shower head) is provided above the mounting stage 22 and faces the mounting stage 22.

The processing chamber 21 is electrically grounded, and an exhaust system 63 is connected via a piping 64 to an exhaust port 62 on the bottom surface of the processing chamber 21. The exhaust system 63 includes a pressure adjusting section (not shown). When the pressure adjusting section receives a control signal from the control section 4, the exhaust system 63 exhausts air inside the processing chamber 21 to a vacuum level, so that the internal space within the processing chamber 21 is preserved at a desired vacuum degree. In FIG. 5, reference numeral 65 denotes a transfer port for a wafer W formed on a side wall of the processing chamber 21, and the transfer port 65 can be opened or closed by a gate valve 66.

The mounting stage 22 comprises a lower electrode 71 and a support body 72 for supporting the lower electrode 71 from the lower side, and is provided on a bottom surface of the processing chamber 21 via an insulating member 73. An electrostatic chuck 74 is placed on the mounting stage 22, and a wafer W is placed on the mounting stage 22 via the electrostatic chuck 74. The electrostatic chuck 74 comprises an insulating material, and an electrode plate 76 connected to a high voltage DC power source 75 is provided within the electrostatic chuck 74. A through hole 74a is provided in the electrostatic chuck 74 for discharging a backside gas to an upper portion of the electrostatic chuck 74.

A cooling medium flow path 77, in which a certain cooling medium (such as a fluorine-based fluid or water known in the conventional technology) flows, is formed in the mounting stage 22. When the cooling medium flows through the cooling medium flow path 77, the mounting stage 22 is cooled, and also the wafer W placed on the mounting stage 22 is cooled to a desired temperature via the mounting stage 22. A temperature sensor (not shown) is mounted on the lower electrode 71, and a temperature of the wafer W on the lower electrode 71 is always monitored via the temperature sensor.

Furthermore, a gas flow path 78 for feeding a thermally-conductive gas such as a He (helium) gas as a backside gas is provided inside the mounting stage 22, and the gas flow path 78 is opened at several positions on an upper surface of the mounting stage 22. The openings are communicated to the through hole 74a provided in the electrostatic chuck 74. When a backside gas is fed to the gas flow path 78, the backside gas flows to the upper portion of the electrostatic chuck 74 via the through hole 74a. When the backside gas is homogeneously diffused in the entire space between the electrostatic chuck 74 and the wafer W placed on the electrostatic chuck 74, the thermal conductivity in the space becomes higher.

The lower electrode 71 is grounded via a high-pass filter (HPF) 7a, and a high frequency power source 71a for supplying a power with a frequency of, for instance, 13.56 MHz is connected to the lower electrode 71 via a matching box 71b. A focus ring 79 is arranged along an outer peripheral edge of the lower electrode 71 and surrounds the electrostatic chuck 74. When plasma is generated via the focus ring 79, the plasma is focused on the wafer W placed on the mounting stage 22.

The upper electrode (gas shower head) 23 is hollow. A number of holes 81 are, for example, homogeneously distributed on a bottom surface of the lower electrode 23 to distribute and supply a process gas to inside of the processing chamber 21. Furthermore, the gas inlet pipe 31 is formed at a center of the top surface of the upper electrode 23, and this gas inlet pipe 31 penetrates a center of the upper surface of the processing chamber 21 via the insulating member 67.

The upper electrode 23 is grounded via a low-pass filter (LPF) 87, and a high frequency power source for supplying a power with the frequency of 60 MHz, which is higher than a frequency of a power supplied from the high frequency power source 71a, is connected to the upper electrode 23 via the matching box 8b. Although not shown in the figure, the high frequency power sources 8a, 71a are connected to the control section 4, and a power supplied from each of the high frequency power sources to each electrode is controlled according to a control signal sent from the control section 4. The upper electrode 23, the lower electrode 71, and the high frequency power sources 71a, 8a are units for generating plasma by converting a process gas to plasma.

The plasma processing apparatus 2 exhausts gases in the processing chamber 21 with the exhaust system 63 to a vacuum level. In the case where a certain process gas is supplied at a certain flow rate into the processing chamber 21 from each of the process gas sources 35A to 35F, when high frequency power is applied to the upper electrode 23 and to the lower electrode 71, the process gas in the processing chamber 21 is changed to plasma (activated). A bias potential is generated in the wafer W by the high frequency power applied to the lower electrode 71. In this state, ion species are drawn into the wafer W and etching is performed to the wafer W which is placed on the mounting stage 22 so that the verticality of the etched portions are improved.

A gas type and a set of process parameters for carrying out each step in the etching process described above with the etching apparatus 2 are, for instance, as described below.
(Step 1: Etching of the SiON film 16)
Pressure in the processing chamber 21: 100 mTorr ($0.13 \times 10^2$ Pa)
Power supplied to the upper electrode (Gas shower head) 23: 1000 W
Power supplied to the lower electrode 71: 400 W
Treatment time: 90 seconds In step 1, the $CF_4$ gas and the $C_4F_8$ gas are used as described above, and a total flow rate of the $CF_4$ gas and the $C_4F_8$ gas is set to 200 sccm. The larger a flow rate of the $CF_4$ gas is, the higher the verticality of the etched form of the SiON film 16 is. Therefore, an opening of the SiON film 16 becomes larger. As a result, an opening dimension of the hole 19 formed using the SiON film 16 as a mask in the subsequent step becomes larger. When the $C_4F_8$ gas is included in the $CF_4$ gas, polymer ingredients from active species in the $C_4F_8$ gas are deposited on a surface of the SiON film 16, and at the same the SiON film 16 is etched by the $CF_4$ gas. Thus, the verticality of the etched portions of the SiON film 16 becomes lower. Therefore, the smaller a flow rate ratio of the $CF_4$ gas relative to the total flow rate, the smaller an opening of an opening of the SiON film 16 is. As a result, the opening dimension of the hole 19 becomes smaller. The flow rate ratio of the $CF_4$ gas is determined by the operation based on the correlations stored in the storage section 51.
(Step 2: Etching of the AC film 15)
Pressure in the processing chamber 21: 10 mTorr ($0.13 \times 10$ Pa)
Flow rate of CO gas: 39 sccm
Flow rate of $O_2$ gas: 25 sccm
Power supplied to the upper electrode 23: 1000 W
Power supplied to the lower electrode 71: 400 W
Treatment time: 60 seconds
(Step 3: Etching of the $SiO_2$ film 14 and the SiN film 15)
Pressure in the processing chamber 21: 30 mTorr ($0.39 \times 10$ Pa)
Flow rate of $CF_4$ gas: 30 sccm
Flow rate of $CHF_3$ gas: 70 sccm
Flow rate of Ar gas: 1200 sccm
Flow rate of $O_2$ gas: 20 sccm
Power supplied to the upper electrode 23: 500 W
Power supplied to the lower electrode 71: 2000 W
Treatment time: 90 seconds
(Step 4: Etching of the $SiO_2$ film 12)
Pressure in the processing chamber 21: 30 mTorr ($0.39 \times 10$ Pa)
Flow rate of $C_4F_8$ gas: 30 sccm
Flow rate of Ar gas: 1200 sccm
Flow rate of $O_2$ gas: 20 sccm
Power supplied to the upper electrode 23: 1500 W
Power supplied to the lower electrode 71: 2000 W
Treatment time: 90 seconds
(Step 5: Ashing of the AC film 15)
Pressure in the processing chamber 21: 60 mTorr ($0.79 \times 10$ Pa)
Flow rate of $O_2$ gas: 500 sccm
Power supplied to the upper electrode 23: 1000 W
Power supplied to the lower electrode 71: 400 W
Treatment time: 60 seconds In the above embodiment, by determining as a target parameter value a flow rate ratio of $CF_4$ for achieving a target opening diameter of the hole 19 in accordance with the actual opening dimension of the resist pattern 18, it is possible to etch the wafer W, so as to make the process parameter correspond to the target parameter value. Thus, even when an opening dimension of the resist pattern 18 varies from wafer to wafer in the previous step of the etching process, it is possible to suppress dispersion in opening dimension of the formed hole 19. As a result, reduction in production yield in the etching process can be prevented.

In the embodiment described above, a process parameter used for determining a target parameter value according to the present invention is a flow rate of an etching gas. However, in place of the gas flow rate, it is possible to use a process parameter selected from a process pressure, a process temperature, and a power supplied to the upper electrode 23.

The reflection preventing film which is a film to be etched is not limited to the SiON film 16, and a film made of SiN (silicon nitride) may be used for the purpose.

Information on an opening dimension of the resist pattern 18 on a wafer W may be fetched into the control section 4, for instance, in the online from the previous step, or a wafer may be set in a testing device before execution of the etching process to measure an opening dimension of the wafer, and the measured value may be fetched into the control section 4.

What is claimed is:

1. An etching method for subjecting an object to be processed to an etching process, the object including: a substrate; a film to be etched that is formed on the substrate; and a photoresist mask provided with an opening, the photoresist mask being formed on the film; to form a concave portion in the film; the etching method comprising the steps of:

determining, in advance, a first correlation between a parameter value of an etching process parameter and an opening dimension of the concave portion, when the etching process is conducted with the use of the mask provided with the opening of a reference opening dimension;

determining, in advance, a second correlation between a variation in opening dimension of the opening the mask and a variation in opening dimension of the concave portion in the film;

measuring an actual opening dimension of the opening in the mask in the object that is to be subjected to the etching process;

determining a target parameter value of the etching process parameter for achieving a target opening dimension of the concave portion, based on a difference between the actual opening dimension of the opening in the mask and the reference opening dimension of the opening in the mask, the target opening dimension of the concave portion to be formed, and the first and second correlations; and conducting an etching process to the object to be processed, so as to make the etching process parameter correspond to the target etching parameter value, wherein the etching process is conducted by using at least two types of etching gases, and the etching process parameter is a ratio of flow rates of the etching gases.

2. The etching method according to claim 1, wherein the film to be etched is a reflection preventing film containing silicon, oxygen, and nitrogen, and the etching gases are a $CF_4$ gas and a $C_4F_8$ gas.

3. A non-transitory computer-readable storage medium storing a control program for performing the etching method according to claim 1 in an etching apparatus.

* * * * *